United States Patent [19]
Cheek et al.

[11] Patent Number: 5,935,766
[45] Date of Patent: Aug. 10, 1999

[54] METHOD OF FORMING A CONDUCTIVE PLUG IN AN INTERLEVEL DIELECTRIC

[75] Inventors: Jon Cheek, Round Rock; Daniel Kadosh; Derick J. Wristers, both of Austin, all of Tex.

[73] Assignee: Advanced Micro Devices, Inc., Sunnyvale, Calif.

[21] Appl. No.: 08/908,487

[22] Filed: Aug. 7, 1997

[51] Int. Cl.⁶ .............................. G03F 7/00; H01L 21/02
[52] U.S. Cl. ..................... 430/316; 430/312; 430/313; 430/314
[58] Field of Search .................... 430/312, 313, 430/316

[56] References Cited

U.S. PATENT DOCUMENTS

| | | | |
|---|---|---|---|
| 4,717,449 | 1/1988 | Erie et al. | 437/195 |
| 4,943,539 | 7/1990 | Wilson et al. | 437/195 |
| 4,996,133 | 2/1991 | Brighton et al. | 430/313 |
| 5,110,712 | 5/1992 | Kessler et al. | 430/312 |
| 5,130,229 | 7/1992 | Chang et al. | 430/312 |
| 5,162,260 | 11/1992 | Leibovitz et al. | 437/195 |
| 5,200,300 | 4/1993 | Leibovitz et al. | 430/312 |
| 5,451,543 | 9/1995 | Woo et al. | 437/195 |
| 5,472,825 | 12/1995 | Sayka | 430/311 |
| 5,612,254 | 3/1997 | Mu et al. | 437/195 |
| 5,756,396 | 5/1998 | Lee et al. | 438/622 |
| 5,780,188 | 7/1998 | Rolson | 430/30 |

OTHER PUBLICATIONS

Wolf, Stanley, Silicon Processing for the VLSI Era, vol. 1: Process Technology, Lattice Press, Sunset Beach, California, 1986, pp. 437–438.

Wolf, Stanley, Silicon Processing for the VLSI Era, vol. 2: Process Integration, Lattice Press, Sunset Beach, California, 1990, pp. 101–111; 189–199; 240–259; 276–283.

*Primary Examiner*—Janet Baxter
*Assistant Examiner*—Jill N. Holloman
*Attorney, Agent, or Firm*—Skjerven, Morrill, MacPherson, Franklin & Friel, L.L.P.; William W. Holloway

[57] ABSTRACT

A method of forming a conductive plug in an interlevel dielectric includes forming a lower dielectric layer over a semiconductor substrate. A first etch mask is formed over the lower dielectric layer and is patterned using a reticle. A first etch is applied through an opening in the first etch mask to form an opening in the lower dielectric layer. A lower conductor is formed in the opening in the lower dielectric layer. A conducting layer is formed over the lower dielectric layer and the lower conductor. A second etch mask is formed over the conducting layer and is patterned using the reticle. A second etch is applied through an opening in the second etch mask to form a contact pad from an unetched portion of the conducting layer. An upper dielectric layer is formed over the lower dielectric layer and the contact pad. A third etch mask is formed over the upper dielectric layer and is patterned using the reticle. A third etch is applied through an opening in the third etch mask to form an opening in the upper dielectric layer. An upper conductor is formed in the opening in the upper dielectric layer. As a result, the conductive plug includes the upper and lower conductors and the contact pad, and the interlevel dielectric includes the upper and lower dielectric layers.

35 Claims, 6 Drawing Sheets

METHOD OF FORMING A CONDUCTIVE PLUG IN AN INTERLEVEL DIELECTRIC

BACKGROUND OF THE INVENTION

1. Field of the Invention

This invention relates to integrated circuit manufacturing, and more particularly to forming a conductive plug in an interlevel dielectric.

2. Description of Related Art

Integrated circuit device fabrication requires that precisely controlled quantities be introduced into or deposited onto tiny regions of a wafer or substrate. Photolithography is typically used to create patterns that define these regions. Typically, a wafer is cleaned and prebaked to drive off moisture and promote adhesion, an adhesion promoter is deposited on the wafer, a few milliliters of photoresist are deposited onto the spinning wafer to provide a uniform layer, the photoresist is soft baked to drive off excess solvents, and the photoresist is irradiated with an image pattern. If positive photoresist is used then the irradiated regions are rendered soluble and the non-irradiated regions remain insoluble, whereas if negative photoresist is used then the irradiated regions are rendered insoluble and the non-irradiated regions remain soluble. Thereafter, a developer removes the soluble portions of the photoresist, an optional de-scum removes very small quantities of photoresist in unwanted areas, and the photoresist is hard baked to remove residual solvents and improve adhesion and mechanical strength. After the photoresist is patterned, the wafer is subjected to an additive process (such as ion implantation) or a subtractive process (such as etching) using the photoresist as a mask. Therefore, the photoresist has the primary functions of replicating the image pattern and protecting the underlying regions from a subsequent processing step.

Photolithographic systems typically use a radiation source (such as a mercury-vapor lamp) and a lens in conjunction with a mask or reticle to selectively irradiate the photoresist. The radiation source projects radiation through the mask or reticle to obtain an image pattern, and the lens focuses the image pattern onto the photoresist. A mask defines an image pattern that covers the entire wafer in a single exposure step, whereas a reticle defines an image pattern that covers only a portion of the wafer. Thus, a reticle is used in step and repeat fashion with a series of exposure steps. For convenience, a reticle is defined herein to include a mask.

A reticle is typically composed of quartz with relatively defect-free surfaces and a high optical transmission at the radiation wavelength. Quartz has a low thermal expansion coefficient and high transmission for near and deep ultraviolet light. Although quartz tends to be expensive, it has become more affordable with the development of high quality synthetic quartz material.

The reticle is prepared by cutting a large quartz plate which is polished and cleaned, and then coated with a mask forming material such as chrome or iron oxide. Chrome is the most widely used material and is typically deposited by sputtering or evaporation to a thickness of less than 1000 angstroms. The chrome is then selectively removed to form the pattern. For instance, a very thin layer of photoresist is deposited on the chrome and patterned (either optically or by an electron beam) by imaging and exposing a set of accurately positioned rectangles, and then a wet etch is applied. Patterning the reticle for a complex VLSI circuit level may require in excess of 100,000 rectangle exposures over a 10 hour period. During this period, extreme temperature control is often necessary to prevent positional errors, and the quality of the reticle cannot be ascertained until after the chrome is etched. Accordingly, reticle fabrication is time consuming and requires significant costs.

As active-device densities on semiconductor wafers increase, the area on the wafer covered by metal interconnect lines increases as well. If only single-level interconnect lines are present on a wafer, increasing the active device density eventually creates a condition in which the area required to interconnect active devices is greater than the total area available on the wafer.

A solution to such interconnect-limited wafers is to employ multiple levels of interconnect.

Although providing a solution to interconnect-limited wafers, multilevel interconnect structures present several difficulties not encountered in single level systems. For example, forming a multilevel interconnect structure inherently necessitates additional and more complex semiconductor processing steps. In order for these additional steps to be reliable, much experimentation, modeling, and testing is necessary. Additionally, using multiple levels of interconnect may lead to a wafer topology which is non-planar. To solve problems associated with non-planar topographies may require additional and complex processing steps, such as chemical-mechanical polishing or sacrificial etchback. Finally, multilevel interconnects often contribute to certain modes of failure more frequently encountered in multilevel systems than in single level systems. For instance, interlevel shorts, electromigration, corrosion, and hillock formations all may arise in multilevel systems and require further characterization and experimentation to overcome.

Another difficulty associated with multilevel interconnect systems is interlevel capacitance. Interlevel capacitance and its associated problems may be illustrated by examining a typical double level metal-oxide-semiconductor field-effect transistor (MOSFET). A MOSFET includes a channel, source, and drain located in a semiconductor substrate. A polysilicon gate is separated from the substrate by a thin insulating layer such as a gate oxide. A first interlevel dielectric (a polysilicon/metal-1 dielectric) is formed over the gate and selectively etched to form openings to the source, drain, and gate. The openings are filled with a metal to form a first group of conductive plugs. Subsequently, a metal-1 pattern is formed over the first interlevel dielectric that selectively interconnects the first group of conductive plugs. Thereafter, a second interlevel dielectric (an intermetal dielectric) is formed over metal-1, a second group of conductive plugs are formed, and a metal-2 pattern is formed over the intermetal dielectric that selectively interconnects the second group of conductive plugs. The operation of the MOSFET involves application of an input voltage to the gate which sets up a transverse electric field in the channel in order to modulate the longitudinal conductance of the channel. From the foregoing, it will be seen that a double-level MOSFET includes a first layer of metal (metal-1) and a second layer of metal (metal-2) with a layer of dielectric (the intermetal dielectric) sandwiched in between. Such a structure forms an interlevel capacitor which may lead to several problems, especially as the metal-1 and metal-2 layers become more dense. For example, it is well known that interlevel capacitance may create increased circuit delay, crosstalk, and power consumption.

In its ultimate simplified form, the interlevel capacitor mentioned above may be viewed as a parallel-plate capacitor filled with an insulator. The metal-1 and metal-2 layers represent the respective parallel plates and the intermetal dielectric represents the insulator. The capacitance of such a parallel plate capacitor is given by $$C = K\frac{A\varepsilon_o}{d}$$

where C is the interlevel capacitance, K is the dielectric constant of the insulator, A is the surface area of the two plates, $\varepsilon_o$ is the permittivity of free space, and d is the distance separating the two plates.

As made apparent by the above equation, reducing the dielectric constant K of the insulator sandwiched between metal-1 and metal-2 will reduce the interlevel capacitance C. Thus, for this and other reasons, it has been common in the semiconductor industry to employ dielectrics having a low dielectric constant ("low-K" dielectrics) as intermetal dielectric layers. Exemplary low-K materials include hydrogen silsesquioxane, fluorinated polyimide, polyphenylquinoxaline, polyquinoline, and methysilsesquixane-polymer. While use of low-K dielectrics has reduced interlevel capacitance problems, room for improvement remains. For instance, even when employing low-K dielectrics, the interlevel capacitance, although reduced, may still cause increased delay, crosstalk, and power consumption.

Also made apparent by the above equation is that interlevel capacitance may be curtailed by reducing the surface area of the metal-1 and metal-2 layers. However, such a solution is not always a viable option, for the size of metal-1 and metal-2 lines is limited by several factors including photolithographic resolution. Additionally, reducing the surface area of the metal-1 and metal-2 layers leads to a corresponding increase in the resistance of metal-1 and metal-2 lines, which may be detrimental to overall device performance. Besides shrinking metal-1 and metal-2 lines themselves, overall parallel-plate surface area may also be reduced by reducing the overall device density. That solution, however, would be counterproductive since success of the semiconductor industry depends, in large part, on continuing to increase the density of active devices.

Finally, it should be noted that increasing the distance between metal-1 and metal-2 (increasing d in the equation above) would also lead to a reduction in interlevel capacitance. Reasoning along these lines, it has been common to experiment in techniques which increase the separation of metal-1 and metal-2 without creating any new processing or reliability problems along the way. One way in which metal layers may be further divided is to simply increase the thickness of the existing intermetal dielectric. Although perhaps the most direct way of increasing the distance between metal layers, a thick intermetal dielectric layer may lead to several processing problems arising when a conductive plug is formed in the thick dielectric. Those problems may override the benefits obtained from thickening the existing dielectric layer. More specifically, using a very thick intermetal dielectric may lead to serious overetching and underetching problems, increased stress and void formation, and poor step coverage.

Overetching arises when the etching of one contact hole through a dielectric is completed before another contact hole through the same dielectric is completed. When a dielectric layer is formed, certain regions of the layer may exhibit a slight slope or disparity in width. The pronounced topographic variations of thick dielectric layers may cause overetch, for an endpoint (as determined by methods such as laser interferometry or optical emission spectroscopy) of a first contact hole will be detected in one region before that of a second contact hole in a region having a varied topography. To ensure that each contact hole is completely formed therefore requires that etching continue until the second contact hole is completed, even though this means that the first contact hole will over-extend into a lower level of the multilevel structure. Overetching thus outlined may lead to several problems including, among other things, gouging of underlying materials beneath the contact hole. Underetching, on the other hand, arises when the etching of a contact hole through a dielectric is not completed. An incomplete contact hole may prevent the desired electrical interconnections from being formed.

Increasing the thickness of the existing single intermetal dielectric may also lead to increased stress and void formation in conductive plugs selectively connecting metal-1 to metal-2. The stress and voids may cause, in turn, various problems such as wafer warpage and electrical shorting between metal-1 and metal-2.

Increasing the thickness of existing single intermetal dielectrics may also lead to poor metal step coverage within contact holes. As device feature sizes continue to decrease, aspect-ratio (via depth divided by via width) dependence of step coverage into contact holes becomes more critical because the percentage of sidewall step coverage decreases with increasing via depth. Thus, thickening an intermetal dielectric and correspondingly forming a deep conductive plug increases the aspect ratio of the contact hole and decreases the amount of step coverage which may be achieved in that conductive plug.

In view of at least the foregoing, it is apparent that a need exists for devising a reliable, convenient and cost-effective method for increasing the separation between metal layers to reduce interlevel capacitance. A need correspondingly exists for a method of forming a conductive plug in an interlevel dielectric to selectively interconnect those separated metal layers.

SUMMARY OF THE INVENTION

A method of forming a conductive plug in an interlevel dielectric includes forming a lower dielectric layer over a semiconductor substrate. A first etch mask is formed over the lower dielectric layer and is patterned using a reticle. A first etch is applied through an opening in the first etch mask to form an opening in the lower dielectric layer. A lower conductor is formed in the opening in the lower dielectric layer. A conducting layer is formed over the lower dielectric layer and the lower conductor. A second etch mask is formed over the conducting layer and is patterned using the reticle. A second etch is applied through an opening in the second etch mask to form a contact pad from an unetched portion of the conducting layer. An upper dielectric layer is formed over the lower dielectric layer and the contact pad. A third etch mask is formed over the upper dielectric layer and is patterned using the reticle. A third etch is applied through an opening in the third etch mask to form an opening in the upper dielectric layer. An upper conductor is formed in the opening in the upper dielectric layer. As a result, the conductive plug includes the upper and lower conductors and the contact pad, and the interlevel dielectric includes the upper and lower dielectric layers.

In accord with one aspect of the invention, the lower conductor is formed on a metal-1 pattern, the contact pad is formed on the lower conductor, the upper conductor is formed on the contact pad, and a metal-2 pattern is formed on the upper conductor. The described method thus effectively provides for increasing the separation between a metal-1 pattern and a metal-2 pattern, thereby reducing interlevel capacitance.

In accord with another aspect of the invention, the first and third etch masks are positive photoresist, and the second etch mask is negative photoresist. Alternatively, the first and third etch masks may be negative photoresist while the second etch mask is positive photoresist. The described selection of photoresists advantageously allows a single reticle to be used for patterning the first, second and third etch masks, thereby providing substantial cost reduction since multiple reticles are unnecessary.

Advantageously, the contact pad may have a substantially greater surface area than each of the upper and lower conductors. The contact pad thus may effectively provide for electrical coupling between the upper and lower conductors even if those conductors are misaligned.

The upper and lower conductors may have similar surface areas and similar compositions which advantageously allows for their respective formation by using similar processing steps. Likewise, the upper and lower dielectric layers may have similar thicknesses and similar compositions which advantageously allow for their respective formation by using similar processing steps.

These and other objects, features, and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
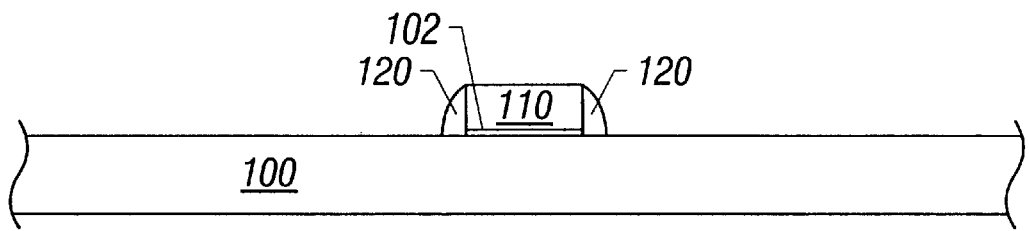
FIGS. 1A–1N show cross-sectional views of successive process steps for forming a conductive plug in an interlevel dielectric in accordance with an embodiment of the invention.

In the drawings, depicted elements are not necessarily drawn to scale and like or similar elements may be designated by the same reference numeral throughout the several views.

In FIG. 1A, a semiconductor substrate 100 suitable for integrated circuit manufacture is provided. The substrate includes a P–type epitaxial surface layer on a P+base layer (not shown). That epitaxial surface layer preferably has a boron background concentration on the order of $1\times10^{15}$ atoms/cm$^3$, a <100> orientation and a resistivity of 12 ohm-cm. Gate oxide 102 composed of silicon dioxide is formed on semiconductor substrate 100 using tube growth at a temperature of 700 to 1000° C. in an $O_2$ containing ambient. Thereafter, a polysilicon layer with a thickness of 2000 angstroms is deposited over substrate 100 by chemical vapor deposition and patterned using photolithography and an etch step to form polysilicon gate 110 on gate oxide 102. Polysilicon gate 110 has a length of about 3500 angstroms between its opposing sidewalls.

Lightly doped source and drain regions (not shown) are formed in substrate 100 by subjecting the structure to ion implantation of phosphorus, at a dose of $1\times10^{13}$ to $5\times10^{14}$ atoms/cm$^2$ and an energy of 2 to 35 kiloelectron-volts, using polysilicon gate 110 as an implant mask. Thereafter, oxide spacers 120 are formed adjacent to the opposing sidewalls of polysilicon gate 110 by conformally depositing an oxide layer with a thickness of 1500 angstroms over substrate 100 by plasma enhanced chemical vapor deposition at a temperature of 300 to 450° C. and applying an anisotropic reactive ion etch which is highly selective of silicon dioxide with respect to silicon. Next, heavily doped source and drain regions (not shown) are formed in substrate 100 by subjecting the structure to ion implantation of arsenic, at a dose of $1\times10^{15}$ to $5\times10^{15}$ atoms/cm$^2$ and an energy of 10 to 80 kiloelectron-volts, using polysilicon gate 110 and oxide spacers 120 as an implant mask.

Figure 1B:
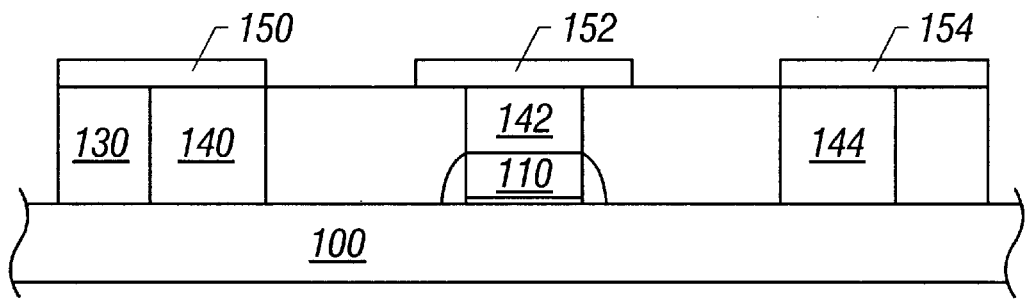

In FIG. 1B, dielectric layer 130 is formed over substrate 100. Dielectric layer 130 is formed by conformally depositing a thick layer of TEOS (tetra-ethyl-ortho-silicate) over the exposed surfaces by plasma enhanced chemical vapor deposition at a temperature of 375° C. The thick layer of TEOS is planarized to a final thickness of about 12,000 angstroms by applying an etchback or chemical-mechanical polishing step. Thereafter, conductive plugs 140, 142, and 144 are formed in dielectric layer 130 and contact polysilicon gate 110 and the source and drain (not shown) in substrate 100. In particular, contact holes are formed in dielectric layer 130 using photolithography and an etch step, the photoresist is removed, a thin titanium layer is sputter deposited into the contact holes and a thin titanium nitride layer is sputter deposited on the titanium layer to provide a Ti/TiN adhesion liner, a thick tungsten layer is sputter deposited on the Ti/TiN adhesion liner to fill the remaining space in the contact holes, and the structure is planarized by chemical-mechanical polishing so that conductive plugs 140, 142 and 144 are formed in the contact holes and are aligned with the top surface of dielectric layer 130. Conductive plugs 140, 142 and 144 have a diameter of about 3500 angstroms.

In addition, a metal-1 pattern is formed on dielectric layer 130. The metal-1 pattern includes metal lines 150, 152, and 154 in contact with conductive plugs 140, 142 and 144, respectively. The metal-1 pattern is formed by sputter depositing an aluminum layer with a thickness of about 6000 angstroms over the structure. The aluminum layer is then patterned using photolithography and an etch step to form metal lines 150, 152, and 154 with linewidths between 4000 and 6000 angstroms. Metal lines 150, 152 and 154 selectively interconnect conductive plugs 140, 142 and 144 with other conductive plugs (not shown) in dielectric layer 130.

Figure 1C:
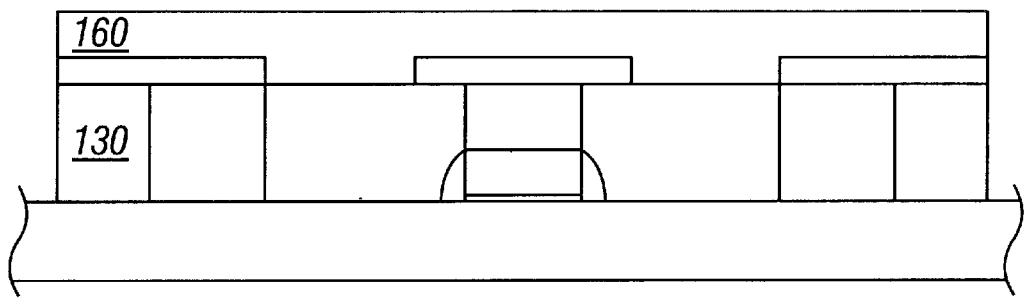

In FIG. 1C, lower dielectric layer 160 is formed on dielectric layer 130 and the metal-1 pattern. Lower dielectric layer 160 is formed in the same manner as dielectric layer 130, except it is thinner. That is, a TEOS layer is deposited and then planarized to a final thickness of about 8000 angstroms. Thus, dielectric layers 130 and 160 have essentially identical compositions but different thicknesses.

Figure 1D:
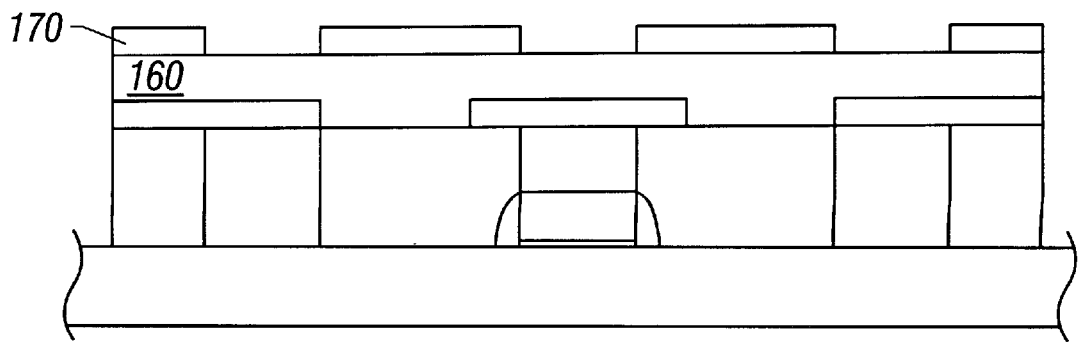

In FIG. 1D, photoresist layer 170, which is positive photoresist, is formed on lower dielectric layer 160. Photoresist layer 170 is patterned using a photolithographic system, such as a step and repeat optical projection system which generates deep ultraviolet light from a mercury-vapor lamp. The photolithographic system projects light through a reticle and a lens to irradiate photoresist layer 170 with an image pattern. Since photoresist layer 170 is positive photoresist, the irradiated portions are removed by a subsequent developer. Thus, photoresist layer 170 includes openings above selected portions of lower dielectric layer 160.

Figure 1E:
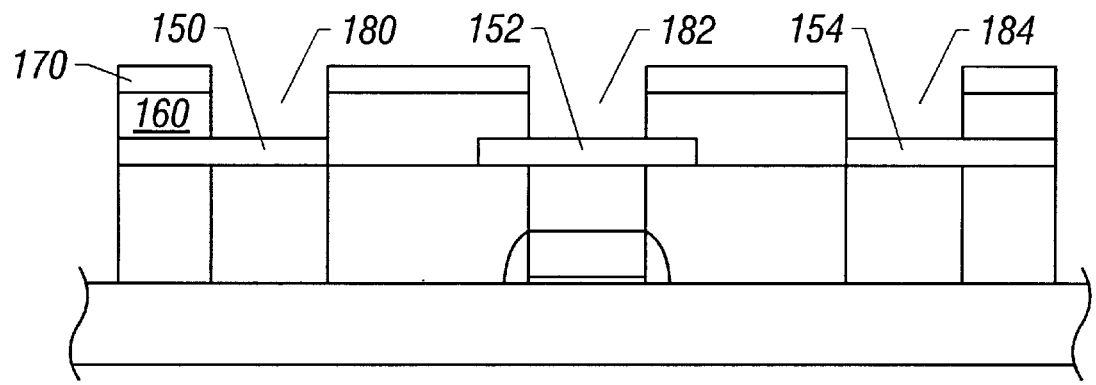

In FIG. 1E, an anisotropic reactive ion etch is applied that is highly selective of lower dielectric layer 160 with respect to metal lines 150, 152 and 154 using photoresist layer 170 as an etch mask. The etch forms openings 180, 182, and 184 in lower dielectric layer 160 which expose metal lines 150, 152, and 154, respectively.

Figure 1F:
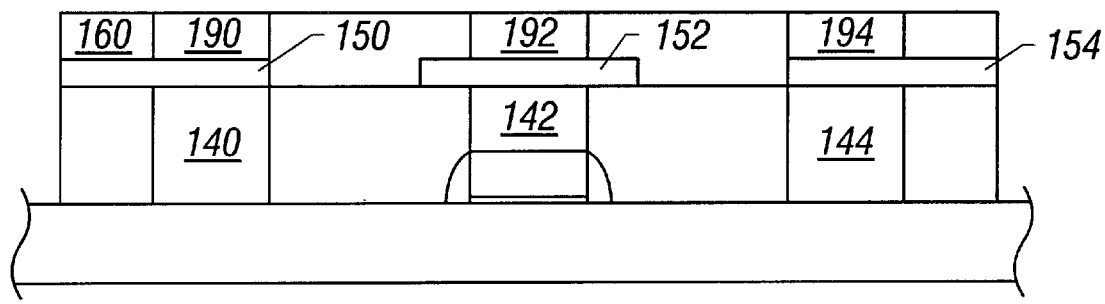

In FIG. 1F, photoresist layer 170 is removed, and lower conductors 190, 192 and 194 are formed in openings 180, 182 and 184, respectively, and on metal lines 150, 152 and 154, respectively. Lower conductors 190, 192 and 194 are formed in the same manner as conductive plugs 140, 142 and 144. That is, a thin Ti/TiN adhesion liner is deposited into openings 180, 182 and 184, a thick tungsten layer is deposited on the Ti/TiN adhesion liner and fills any remaining space in openings 180, 182 and 184, and chemical-mechanical polishing is applied so that lower conductors 190, 192 and 194 are aligned with the top surface of lower dielectric layer 160. Lower conductors 190, 192 and 194 have diameters of about 3500 angstroms.

Figure 1G:
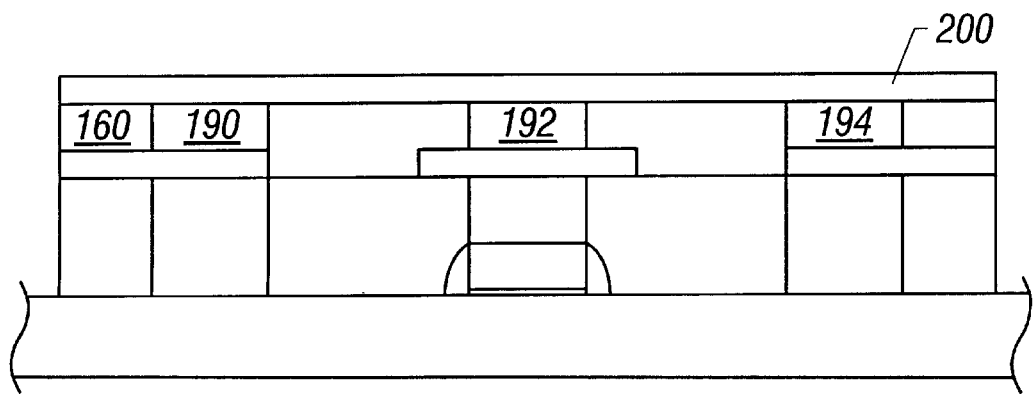

In FIG. 1G, a conducting layer 200 is formed on lower dielectric layer 160 and lower conductors 190, 192, and 194. Conducting layer 200 is formed by sputter depositing an aluminum layer with a thickness of about 2000 angstroms over the structure.

Figure 1H:
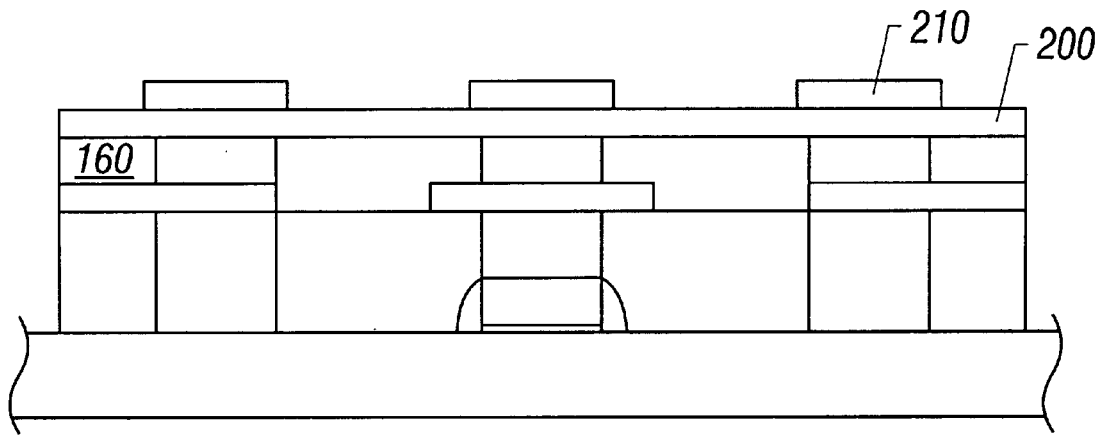

In FIG. 1H, photoresist layer 210, which is negative photoresist, is formed on conducting layer 200. Photoresist layer 210 is patterned using the same reticle, and the same image pattern, that were used to pattern photoresist layer 170. Since photoresist layer 210 is negative photoresist, the non-irradiated portions are removed by a subsequent developer. As a result, photoresist layer 210 includes openings above selected portions of conducting layer 200.

It should be noted, however, that photoresist layer 210 does not represent the mirror image of photoresist layer 170. In particular, the openings in photoresist layer 170 have diameters of about 3500 angstroms, whereas the remaining segments of photoresist layer 210 have diameters of about 5500 angstroms. This is accomplished by applying the image pattern to photoresist layer 170 for a first exposure time, and applying the image pattern to photoresist layer 210 for a second exposure time that differs from the first exposure time, to selectively control the linewidths of photoresist layers 170 and 210. It is well-known that during a certain range of exposure times, photoresist linewidth change is directly proportional to exposure time. See, for instance, Wolf et al., "Silicon Processing For The VLSI Era, Volume 1: Process Technology," published by Lattice Press, Sunset Beach, Calif., 1986, p. 437. It is also well-known that other factors such as radiation intensity, radiation frequency, photoresist thickness, developer concentration, and temperature can affect the linewidth of patterned photoresist.

Figure 1I:
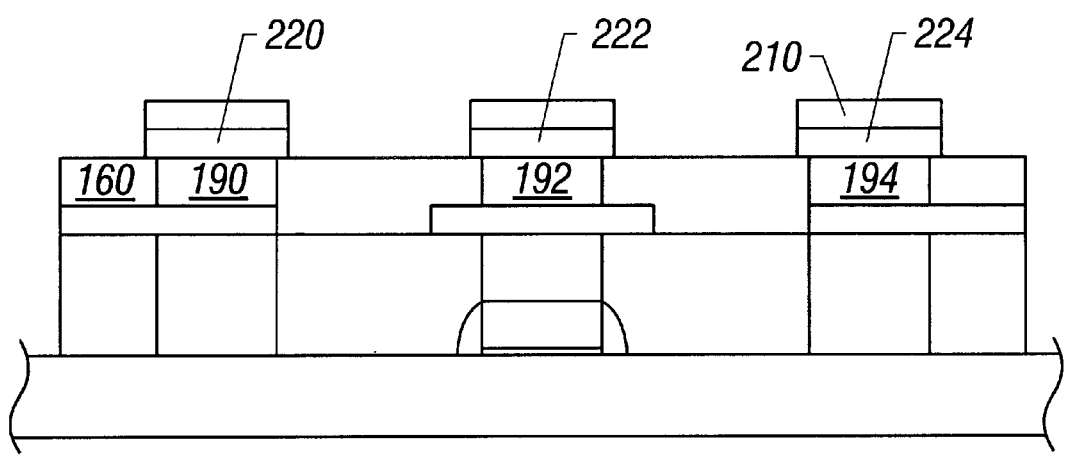

In FIG. 1I, an anisotropic reactive ion etch is applied that is highly selective of conducting layer 200 with respect to lower dielectric layer 160 using photoresist layer 210 as an etch mask. The etch forms contact pads 220, 222 and 224 from unetched portions of conducting layer 200 on lower conductors 190, 192 and 194, respectively. Contact pads 220, 222 and 224 have diameters of about 5500 angstroms. Furthermore, lower conductors 190, 192 and 194 are entirely within the surface areas of contact pads 220, 222 and 224, respectively.

Figure 1J:
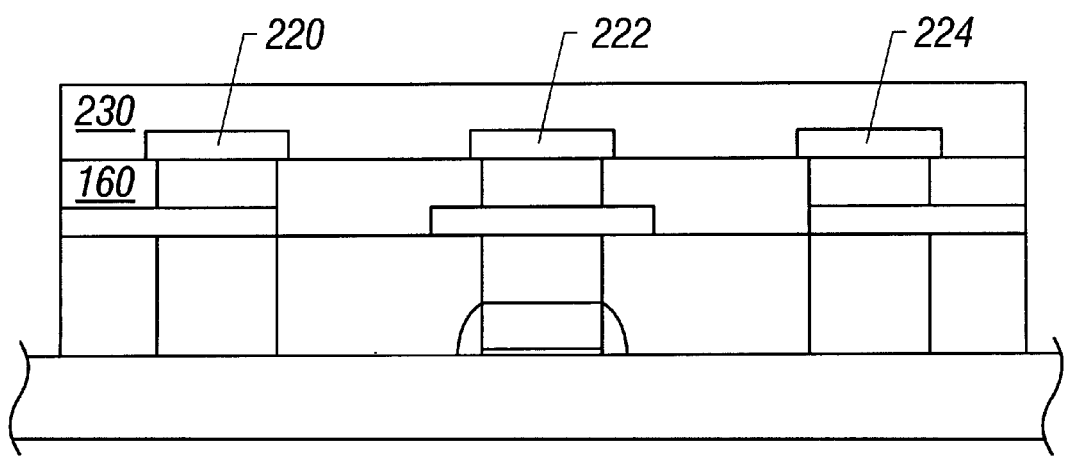

In FIG. 1J, photoresist layer 210 is removed, and upper dielectric layer 230 is formed on lower dielectric layer 160 and contact pads 220, 222 and 224. Upper dielectric layer 230 is formed in the same manner as lower dielectric layer 160. That is, a TEOS layer is deposited and then planarized to a final thickness of about 8000 angstroms. Thus, dielectric layers 160 and 230 have essentially identical compositions and thicknesses.

Figure 1K:
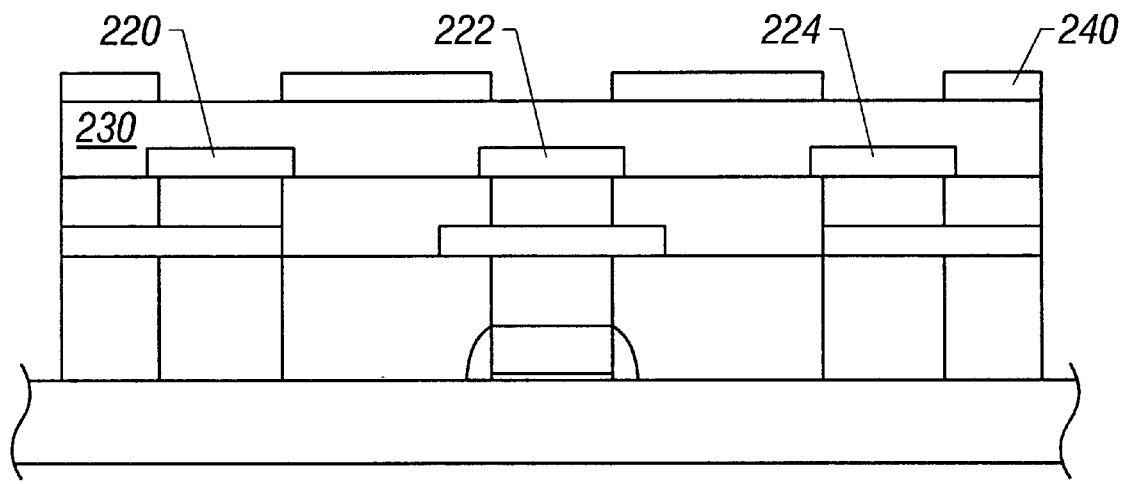

In FIG. 1K, photoresist layer 240, which is positive photoresist, is formed on upper dielectric layer 230. Photoresist layer 240 is patterned using the same reticle, and the same image pattern, that were used to pattern photoresist layer 170. Furthermore, photoresist layers 170 and 240 have essentially identical compositions and thicknesses, and the image pattern is applied to photoresist layers 170 and 240 for essential identical exposure times. Since photoresist layer 240 is positive photoresist, the irradiated portions are removed by a subsequent developer. Thus, photoresist layer 240 includes openings above selected portions of upper dielectric layer 230.

Figure 1L:
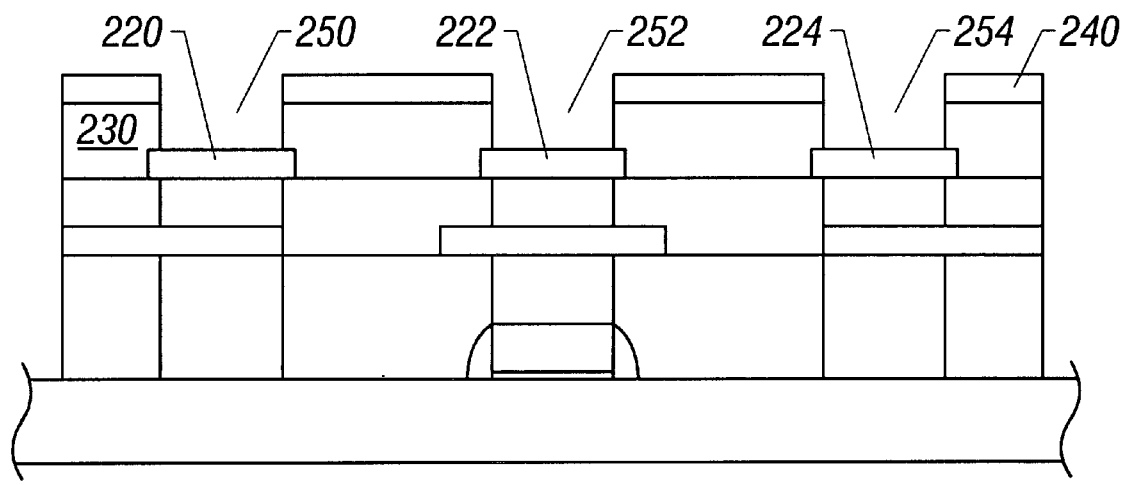

In FIG. 1L, an anisotropic reactive ion etch is applied that is highly selective of upper dielectric layer 230 with respect to contact pads 220, 222 and 224 using photoresist layer 240 as an etch mask. The etch forms openings 250, 252, and 254 in upper dielectric layer 230 which expose contact pads 220, 222, and 224, respectively.

Figure 1M:
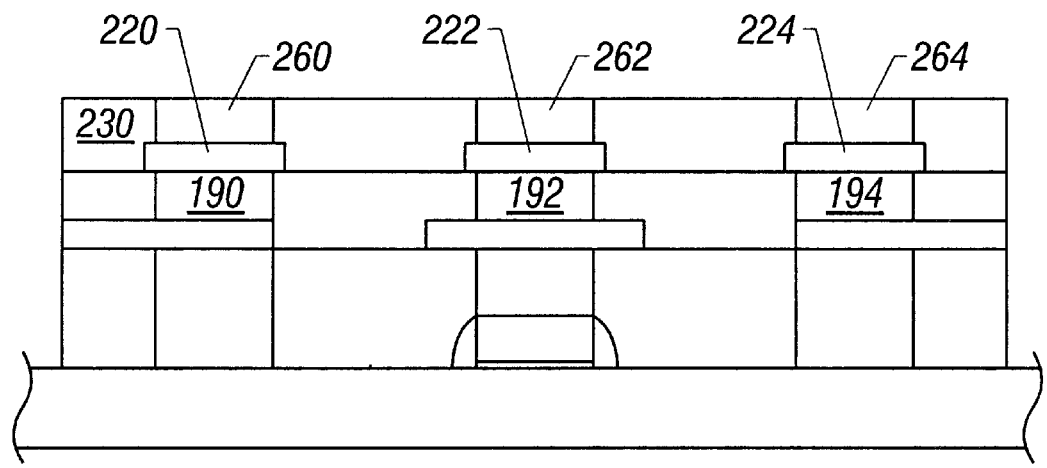

In FIG. 1M, photoresist layer 240 is removed, and upper conductors 260, 262 and 264 are formed in openings 250, 252 and 254, respectively, and on contact pads 220, 222 and 224, respectively. Upper conductors 260, 262 and 264 are formed in the same manner as lower conductors 190, 192 and 194. That is, a thin Ti/TiN adhesion liner is deposited into openings 250, 252 and 254, a thick tungsten layer is deposited on the Ti/TiN adhesion liner and fills any remaining space in openings 250, 252 and 254, and chemical-mechanical polishing is applied so that upper conductors 260, 262 and 264 are aligned with the top surface of upper dielectric layer 220. Upper conductors 260, 262 and 264 have diameters of about 3500 angstroms. Furthermore, upper conductors 260, 262 and 264 are entirely within the surface areas of contact pads 220, 222 and 224, respectively. Thus, contact pads 220, 222 and 224 are slightly oversized with respect to lower conductors 190, 192 and 194, and upper conductors 260, 262 and 264, in order to accommodate misalignment between the upper and lower conductors, thereby assuring adequate electrical coupling between the upper and lower conductors.

Figure 1N:
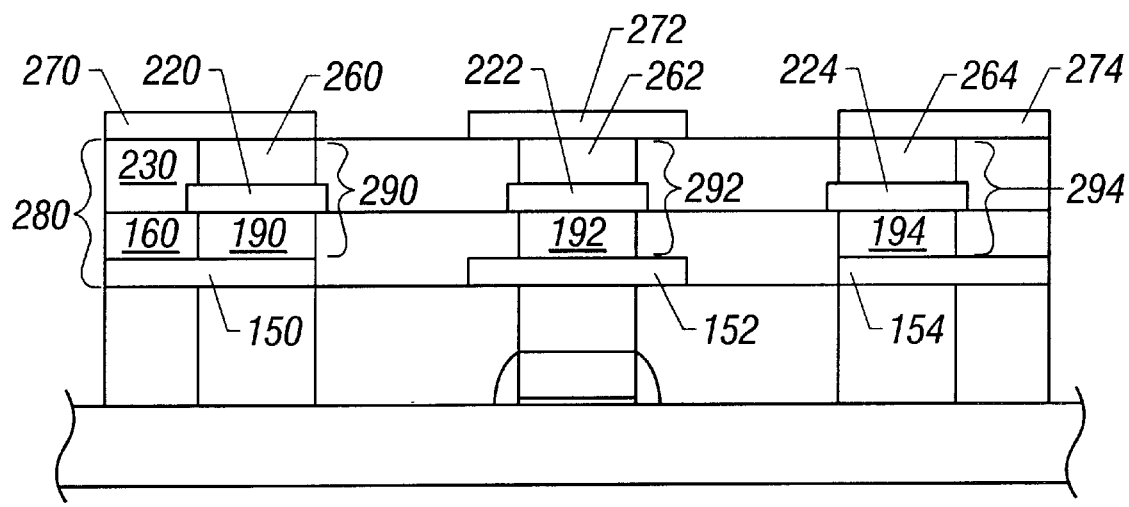

In FIG. 1N, a metal-2 pattern is formed on upper dielectric layer 230 and upper conductors 260, 262 and 264. The metal-2 pattern includes metal lines 270, 272, and 274 in contact with upper conductors 260, 262 and 264, respectively. The metal-2 pattern is formed in the same manner as the metal-1 pattern. That is, an aluminum layer with a thickness of 6000 angstroms is sputter deposited over the structure, and the aluminum layer is then patterned using photolithography and an etch step to form metal lines 270, 272, and 274 with linewidths between 4000 and 6000 angstroms. Metal lines 270, 272 and 274 selectively interconnect upper conductors 260, 262 and 264 with other upper conductors (not shown) in upper dielectric layer 230.

Accordingly, interlevel dielectric 280 consists of upper dielectric layer 230 and lower dielectric layer 160, and conductive plugs 290, 292 and 294 in interlevel dielectric 280 consist of upper conductors 260, 262 and 264, contact pads 220, 222 and 224, and lower conductors 190, 192 and 194, respectively. Thus, conductive plug 290 electrically couples metal lines 150 and 270, conductive plug 292 electrically couples metal lines 152 and 272, and conductive plug 294 electrically couples metal lines 154 and 274.

It should also be noted that the only electrical conductors the lower conductors contact are the metal-1 lines and the contact pads in their respective conductive plugs, the only electrical conductors the contact pads contact are the upper conductors in their respective conductive plugs and the lower conductors in their respective conductive plugs, and the only electrical conductors the upper conductors contact are the metal-2 lines and the contact pads in their respective conductive plugs. For instance, the only electrical conductors that lower conductor 190 contacts are metal-1 line 150 and contact pad 220, the only electrical conductors that contact pad 220 contacts are upper conductor 260 and lower conductor 190, and the only electrical conductors that upper conductor 260 contacts are metal-2 line 270 and contact pad 220.

Figure 2:
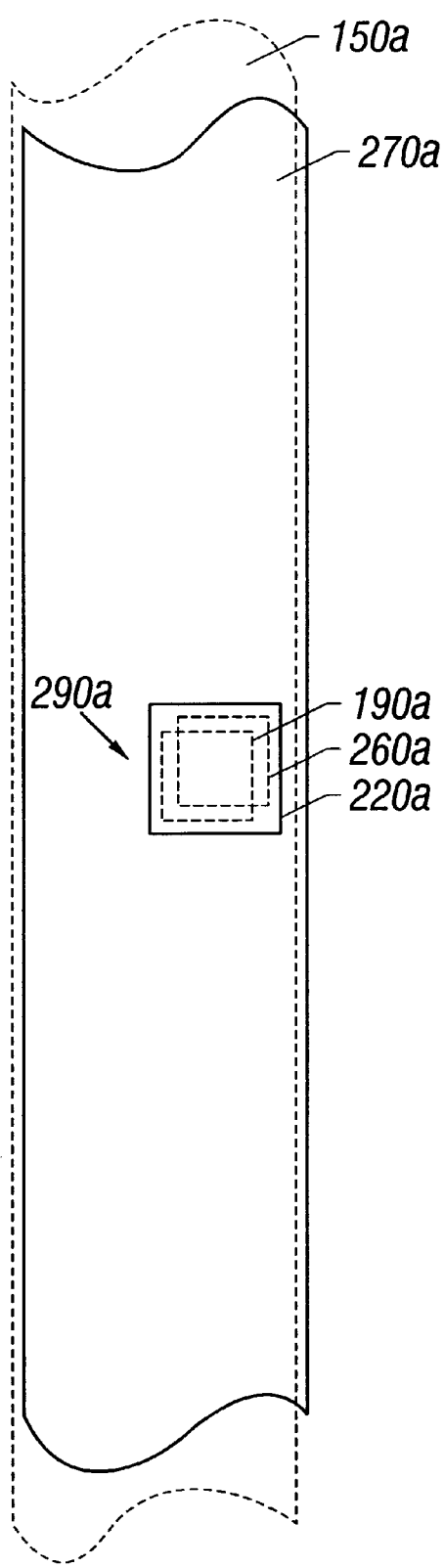
FIG. 2 shows a plan view of a conductive plug in an interlevel dielectric in accordance with an embodiment of the invention.

FIG. 2 is a plan view of a conductive plug in an interlevel dielectric. The elements shown (e.g., metal-1 line 150A, lower conductor 190A, etc.) are similar to elements previously described (e.g., metal-1 line 150, lower conductor 190, etc.), except that greater misalignment exists. Conductive plug 290A electrically couples metal-1 line 150A (shown with dashed lines) and metal-2 line 270A (shown with solid lines). Conductive plug 290A includes upper conductor 260A (shown with dashed lines), contact pad 220A (shown with solid lines) and lower conductor 190A (shown with dashed and dotted lines). As is seen, upper conductor 260A and lower conductor 190A overlap one another, but are misaligned. However, the entire surface areas of upper conductor 260A and lower conductor 190A are within the surface area of contact pad 220A.

As can be appreciated, the overlay misalignment described above is not necessary or even desirable, yet such misalignment can be accommodated by oversizing the surface areas of the contact pads with respect to the upper and lower conductors. Therefore, alignment tolerances may be relaxed to yield a more forgiving and less expensive process without unduly increasing the potential for device failure.

The present invention includes numerous variations to the embodiments described above.

For instance, the conductive plug can be formed in any interlevel dielectric, such as a polysilicon/metal-1 dielectric or a metal-2/metal-3 dielectric. The interlevel dielectric may include additional dielectric layers, and the conductive plug may include additional electrical conductors. For example, a three-layer interlevel dielectric with upper, middle and lower dielectric layers may include upper, middle and lower conductors, with upper contact pads between the upper and middle conductors, and lower contact pads between the middle and lower conductors.

The contact pads need not necessarily have oversized surface areas with respect to the upper and lower conductors. The precise size of the contact pads with respect to the upper and lower conductors will depend on numerous factors, including the misalignment tolerance between the upper and lower conductors, the spacing between adjacent conductive plugs, and the desired amount of interlevel capacitance.

If a single reticle is employed, the first and third photoresist layers can be positive photoresist and the second photoresist layer can be negative photoresist, or alternatively, the first and third photoresist layers can be negative photoresist and the second photoresist layer can be positive photoresist. Of course, multiple reticles can be used, in which case the first, second and third photoresist layers can be any combination of positive or negative photoresist. If desired, the photoresist layers can pattern hard masks such as silicon nitride to be used as the etch masks.

The conducting layer that provides the contact pads can also provide some or all of the lower conductors. Likewise, the metal layer that provides the metal pattern on the upper dielectric layer can also provide some or all of the upper conductors.

The upper and lower dielectrics can be various materials such as low-K dielectrics. Similarly, the conductive plug and metal patterns can include various metals and related compounds. For instance, the upper and lower conductors can include tungsten, tantalum, titanium, titanium nitride, molybdenum, polysilicon, or a silicide, and the contact pads, metal-1 pattern and metal-2 pattern can include aluminum, aluminum alloys, copper, gold, silver, tungsten or molybdenum.

Although conductive plugs have been shown above a single device for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

The method of forming a conductive plug in an interlevel dielectric according to the present invention provides significant advantages. In particular, the method provides for reducing interlevel capacitance by increasing the separation between multilevel metal lines. As mentioned earlier, reducing interlevel capacitance alleviates problems of circuit delay, crosstalk, and high power consumption. Additionally, the present invention reduces interlevel capacitance in a convenient and cost-effective manner since a single reticle can be used to pattern the etch masks for both the openings in the interlevel dielectric and the contact pads inside the interlevel dielectric.

The foregoing description has been directed to particular embodiments of the invention in accordance with the requirements of the Patent Statutes for the purposes of illustration and explanation. It will be apparent, however, to those skilled in the art that many modifications and changes in the method and apparatus set forth will be possible without departing from the scope and spirit of the invention. It is intended that the following claims be interpreted to embrace all such modifications and changes.

What is claimed is:

1. A method of forming a conductive plug in an interlevel dielectric, comprising:

providing a semiconductor substrate;

forming a lower dielectric layer over the substrate;

forming a first etch mask on the lower dielectric layer, wherein the first etch mask is patterned using a reticle;

performing a first etch through an opening in the first etch mask to form an opening in the lower dielectric layer;

forming a lower conductor in the opening in the lower dielectric layer;

forming a conducting layer on the lower dielectric layer and the lower conductor;

forming a second etch mask on the conducting layer, wherein the second etch mask is patterned using the reticle;

performing a second etch through an opening in the second etch mask to form a contact pad from an unetched portion of the conducting layer;

forming an upper dielectric layer on the lower dielectric layer and the contact pad;

forming a third etch mask on the upper dielectric layer, wherein the third etch mask is patterned using the reticle;

performing a third etch through an opening in the third etch mask to form an opening in the upper dielectric layer; and forming an upper conductor in the opening in the upper dielectric layer;

wherein the conductive plug includes the upper and lower conductors and the contact pad, and the interlevel dielectric includes the upper and lower dielectric layers.

2. The method of claim 1, wherein the first and third etch masks are positive photoresists, and the second etch mask is a negative photoresist.

3. The method of claim 1, wherein the first and third etch masks are negative photoresists, and the second etch mask is a positive photoresist.

4. The method of claim 1, wherein the first, second and third etch masks are photoresists and are patterned by an image pattern using the reticle with a photolithographic step and repeat system.

5. The method of claim 1, wherein the conductive plug consists of the upper and lower conductors and the contact pad, and the interlevel dielectric consists of the upper and lower dielectric layers.

6. The method of claim 1, wherein the lower conductor is formed on a metal-1 pattern, the contact pad is formed on the lower conductor, the upper conductor is formed on the contact pad, and a metal-2 pattern is formed on the upper conductor.

7. The method of claim 1, wherein the contact pad has a greater surface area than that of the lower conductor, and the contact pad has a greater surface area than that of the upper conductor.

8. The method of claim 1, wherein the upper and lower dielectric layers have similar thicknesses, and the upper and lower conductors have similar surface areas.

9. The method of claim 1, including manufacturing an integrated circuit chip that includes the conductive plug and the interlevel dielectric.

10. The method of claim 1, including manufacturing an electronic system that includes a microprocessor, a memory and a system bus, and that further includes the conductive plug and the interlevel dielectric.

11. A method of forming a conductive plug in an interlevel dielectric, comprising:
providing a semiconductor substrate;
forming a lower dielectric layer over the substrate;
forming a first photoresist layer on the lower dielectric layer, wherein the first photoresist layer is patterned using a reticle;
performing a first etch through an opening in the first photoresist layer to form an opening in the lower dielectric layer;
removing the first photoresist layer;
forming a lower conductor in the opening in the lower dielectric layer;
forming a conducting layer on the lower dielectric layer and the lower conductor;
forming a second photoresist layer on the conducting layer, wherein the second photoresist layer is patterned using the reticle;
performing a second etch through an opening in the second photoresist layer to form a contact pad from an unetched portion of the conducting layer;
removing the second photoresist layer;
forming an upper dielectric layer on the lower dielectric layer and the contact pad;
forming a third photoresist layer the upper dielectric layer, wherein the third photoresist layer is patterned using the reticle;
performing a third etch through an opening in the third photoresist layer to form an opening in the upper dielectric layer;
removing the third photoresist layer; and
forming an upper conductor in the opening in the upper dielectric layer;
wherein the conductive plug includes the upper and lower conductors and the contact pad, and the interlevel dielectric includes the upper and lower dielectric layers.

12. The method of claim 11, wherein the first and third photoresist layers are positive photoresists, and the second photoresist layer is a negative photoresist.

13. The method of claim 11, wherein the first and third photoresist layers are negative photoresists, and the second photoresist layer is a positive photoresist.

14. The method of claim 11, wherein conductive plug consists of the upper and lower conductors and the contact pad, and the interlevel dielectric consists of the upper and lower dielectric layers.

15. The method of claim 11, wherein the lower conductor is formed on a metal-1 pattern, the contact pad is formed on the lower conductor, the upper conductor is formed on the contact pad, and a metal-2 pattern is formed on the upper conductor.

16. The method of claim 11, wherein the contact pad has a greater surface area than that of the lower conductor, the contact pad has a greater surface area than that of the upper conductor, and the first, second and third etches are anisotropic etches.

17. The method of claim 11, wherein the upper and lower conductors have similar surface areas, and the upper and lower dielectric layers have similar thicknesses.

18. The method of claim 11, wherein the upper and lower conductors have similar compositions, and the upper and lower dielectric layers have similar compositions.

19. The method of claim 11, wherein the first and third photoresist layers have similar thicknesses and compositions.

20. The method of claim 11, wherein the first, second and third photoresist layers are patterned by an image pattern using the reticle with a photolithographic step and repeat system.

21. The method of claim 20, wherein the first and third photoresist layers receive a first amount of radiation from the image pattern, and the second photoresist layer receives a second amount of radiation from the image pattern that is different than the first amount of radiation.

22. The method of claim 21, wherein the first and third photoresist layers are irradiated by the image pattern for a first exposure time, and the second photoresist layer is irradiated by the image pattern for a second exposure time that is different than the first exposure time.

23. The method of claim 11, including planarizing the lower dielectric layer, the lower conductor, the upper dielectric layer and the upper conductor by applying first, second, third and fourth chemical-mechanical polishing steps, respectively.

24. The method of claim 11, wherein the contact pad does not contact any electrical conductor other than the upper and lower conductors.

25. The method of claim 11, including performing the steps in the sequence set forth.

26. A method of forming a conductive plug in an interlevel dielectric between a metal-1 pattern and a metal-2 pattern, the method comprising the steps of:
providing a semiconductor substrate;
forming the metal-1 pattern over the substrate;
forming a lower dielectric layer on the metal-1 pattern;

forming a first photoresist layer on the lower dielectric layer, wherein patterning the first photoresist layer includes irradiating the first photoresist layer with an image pattern using a reticle;

performing a first etch through an opening in the first photoresist layer to form an opening in the lower dielectric layer that exposes the metal-1 pattern;

removing the first photoresist layer;

forming a lower conductor in the opening in the lower dielectric layer that contacts the metal-1 pattern;

forming a conducting layer on the lower dielectric layer and the lower conductor;

forming a second photoresist layer on the conducting layer, wherein patterning the second photoresist layer includes irradiating the second photoresist layer with the image pattern using the reticle;

performing a second etch through an opening in the second photoresist layer to form a contact pad from an unetched portion of the conducting layer that contacts the lower conductor;

removing the second photoresist layer;

forming an upper dielectric layer on the lower dielectric layer and the contact pad;

forming a third photoresist layer on the upper dielectric layer, wherein patterning the third photoresist layer includes irradiating the third photoresist layer with the image pattern using the reticle;

performing a third etch through an opening in the third photoresist layer to form an opening in the upper dielectric layer that exposes the contact pad;

removing the third photoresist layer;

forming an upper conductor in the opening in the upper dielectric layer that contacts the contact pad; and forming the metal-2 pattern on the upper dielectric layer and the upper conductor;

wherein the conductive plug consists of the upper and lower conductors and the contact pad, and the interlevel dielectric consists of the upper and lower dielectric layers.

27. The method of claim 26, wherein the first and third photoresist layers are positive photoresists, and the second photoresist layer is a negative photoresist.

28. The method of claim 26, wherein the first and third photoresist layers are negative photoresists, and the second photoresist layer is a positive photoresist.

29. The method of claim 26, wherein the contact pad has a greater surface area than that of the lower conductor, the contact pad has a greater surface area than that of the upper conductor, and the first, second and third etches are anisotropic etches.

30. The method of claim 26, wherein:

the upper and lower conductors have identical surface areas and compositions;

the upper and lower dielectric layers have identical thicknesses and compositions; and the first and third photoresist layers have identical thicknesses and compositions.

31. The method of claim 26, wherein the metal-1 pattern, metal-2 pattern and contact pad include aluminum, and the upper and lower conductors include tungsten.

32. The method of claim 26, wherein the first and third photoresist layers are irradiated by the image pattern for a first exposure time, and the second photoresist layer is irradiated by the image pattern for a second exposure time that is different than the first exposure time.

33. The method of claim 26, including planarizing the lower dielectric layer, the lower conductor, the upper dielectric layer and the upper conductor by applying first, second, third and fourth chemical-mechanical polishing steps, respectively.

34. The method of claim 26, wherein:

the lower conductor does not contact any electrical conductor other than the metal-1 pattern and the contact pad;

the contact pad does not contact any electrical conductor other than the upper and lower conductors; and the upper conductor does not contact any electrical conductor other than the metal-2 pattern and the contact pad.

35. The method of claim 26, including performing the steps in the sequence set forth.

* * * * *